(12) United States Patent
Yaegashi (10) Patent No.: US 8,263,320 B2
(45) Date of Patent: Sep. 11, 2012

(54) METHOD, PROGRAM AND SYSTEM FOR PROCESSING SUBSTRATE

(75) Inventor: Hidetami Yaegashi, Nirasaki (JP)

(73) Assignee: Tokyo Electron Limited (JP)

( * ) Notice: Subject to any disclaimer, the term of this patent is extended or adjusted under 35 U.S.C. 154(b) by 222 days.

(21) Appl. No.: 12/718,568

(22) Filed: Mar. 5, 2010

(65) Prior Publication Data

US 2010/0159402 A1   Jun. 24, 2010

Related U.S. Application Data

(63) Continuation-in-part of application No. PCT/JP2008/065488, filed on Aug. 29, 2008.

(30) Foreign Application Priority Data

Sep. 7, 2007 (JP) ................................. 2007-232263

(51) Int. Cl.
    *G03F 7/26* (2006.01)
(52) U.S. Cl. ....................................... 430/323
(58) Field of Classification Search ................ 430/315, 430/313, 314, 323, 324, 329
    See application file for complete search history.

(56) References Cited

U.S. PATENT DOCUMENTS

| | | | |
|---|---|---|---|
| 5,013,680 A | 5/1991 | Lowrey et al. | |
| 2002/0042158 A1* | 4/2002 | Kersch et al. | 438/29 |
| 2008/0128867 A1* | 6/2008 | Lee | 257/629 |
| 2008/0305642 A1* | 12/2008 | Lee et al. | 438/703 |

FOREIGN PATENT DOCUMENTS

| | | |
|---|---|---|
| JP | 63-155621 | 6/1988 |
| JP | 07-273084 | 10/1995 |
| JP | 07-326621 | 12/1995 |
| JP | 09-205081 | 8/1997 |
| JP | 09-237777 | 9/1997 |
| KR | 10-2006-0051463 | 5/2006 |
| KR | 10-2007-0036670 | 4/2007 |
| KR | 10-0810163 | 2/2008 |

OTHER PUBLICATIONS

Korean Office Action—Korean Application No. 10-2010-7005089 issued on Jun. 15, 2011, citing KR 10-2007-0036670, KR 10-0810163, and KR 10-2006-0051463.
International Search Report—PCT/JP2008/065488 dated Nov. 18, 2008.

* cited by examiner

*Primary Examiner* — Kathleen Duda
*Assistant Examiner* — Caleen Sullivan
(74) *Attorney, Agent, or Firm* — Cantor Colburn LLP (57) ABSTRACT

The invention relates to a method for processing a substrate on which a target film is formed. The method includes forming a first film on the target layer; forming a second film on the first film, the second film being photosensitive; patterning the second film with a photolithography process; removing a portion of the first film selectively using the second film as a mask; removing a portion of the target film selectively using the second film as a mask; reducing the width of first film to an intended width by removing sidewall portions thereof; forming a third film at least on the first film and on the top of the target film; removing the first film and the second film; and removing a portion of the target film using the third film as a mask.

15 Claims, 13 Drawing Sheets

METHOD, PROGRAM AND SYSTEM FOR PROCESSING SUBSTRATE

CROSS-REFERENCE TO RELATED APPLICATION

The present application is a continuation-in-part application of International Patent Application No. PCT/JP2008/065488 filed Aug. 29, 2008, which claims priority to Japanese Patent Application No. 2007-232263, filed Sep. 7, 2007. The contents of these applications are incorporated herein by reference in their entirety.

BACKGROUND OF THE INVENTION

1. Field of the Invention

The present invention relates to a method, a program and system for processing a substrate, such as semiconductor wafer.

2. Description of Related Art

In one example of a photolithographic process in a manufacturing process of semiconductor device, a photoresist film is patterned with sequentially conducted processes: coating photoresist on a target film formed on a semiconductor wafer (hereinafter referred to as "wafer"), exposing the photoresist film to optical radiation having a specific pattern, developing the exposed photoresist film and the like. After that, the target film is patterned through etching the target film using the patterned photoresist film as a mask and removing the photoresist.

To scale down the minimum feature size of a semiconductor device structure, it is being attempted to shorten the wavelength of optical radiation exposing in a photolithographic process. It is, however, hard to scale down the size of, for instance, 32 nm or 45 nm node, depending only on such shortening wavelength.

Japanese Patent No. 2757983 offers a method for scaling down the minimum feature size of a semiconductor device. In the method, different layers on a target film on a wafer are respectively patterned. In particular, first and second patterns of photosensitive films are formed through coating first and second photosensitive films on a target film, and exposing and developing the first and second films, respectively. Then, the target film is patterned by etching using the first and second patterns of photosensitive films as masks.

However, when forming a fine pattern in a target film using the method described in Japanese Patent No. 2757983, it is necessary to accurately align the second pattern relative to the first pattern. There is a high possibility that the two patterns are misaligned. When misalignment occurs, the intended pattern of the target film can not be obtained. Besides, it needs to expose a photosensitive film twice. That makes the cost for manufacturing a semiconductor device high.

U.S. Pat. No. 5,013,680 offers another method for scaling down the minimum feature size of a semiconductor device. In the method, a $SiO_2$ film is formed on a patterned SiN film formed on a target film on a wafer, for instance, with a CVD (chemical vapor deposition) process. A fine pattern of $SiO_2$ film is formed thorough etching back the $SiO_2$ film and removing the SiN film. Then, a target layer is patterned by etching using the $SiO_2$ pattern as a mask.

In a case that a fine pattern of target film is formed using a method described in the United States Patent, each top portion of $SiO_2$ pattern formed on both sides of SiN film has asymmetric shape. Etching with such $SiO_2$ pattern as a mask, a target film having uniform pattern height cannot be obtained.

SUMMARY OF THE INVENTION

A method for processing a substrate on which a target film is formed is disclosed. The method includes forming a first film on the target layer; forming a second film on the first film, the second film being photosensitive; patterning the second film with a photolithography process; removing a portion of the first film selectively using the second film as a mask; removing a portion of the target film selectively using the second film as a mask; reducing the width of first film to an intended width by removing sidewall portions thereof; forming a third film at least on the first film and on the top of the target film; removing the first film and the second film; and removing a portion of the target film using the third film as a mask.

A device for processing a substrate on which a target film is formed is further disclosed. The method include a coating unit configured to coat a first film on the target film; a coating unit configured to coat a second film on the first film; a exposure configured to expose the second film selectively to optical radiation; a developing unit configured to develop the exposed second film; a removing unit configured to remove a portion of the first film selectively using the second film as a mask; a removing unit configured to remove a portion of the target film selectively using the second film as a mask; a removing unit configured to remove the sidewall portions of first film to an intended width thereof; a film forming unit configured to form a third film at least on the first film and on the top of the target film; a removing unit configured to remove the first film and the second film; and a removing unit configured to remove a portion of the target film using the third film as a mask.

DETAILED DESCRIPTION OF THE INVENTION

Figure 1:
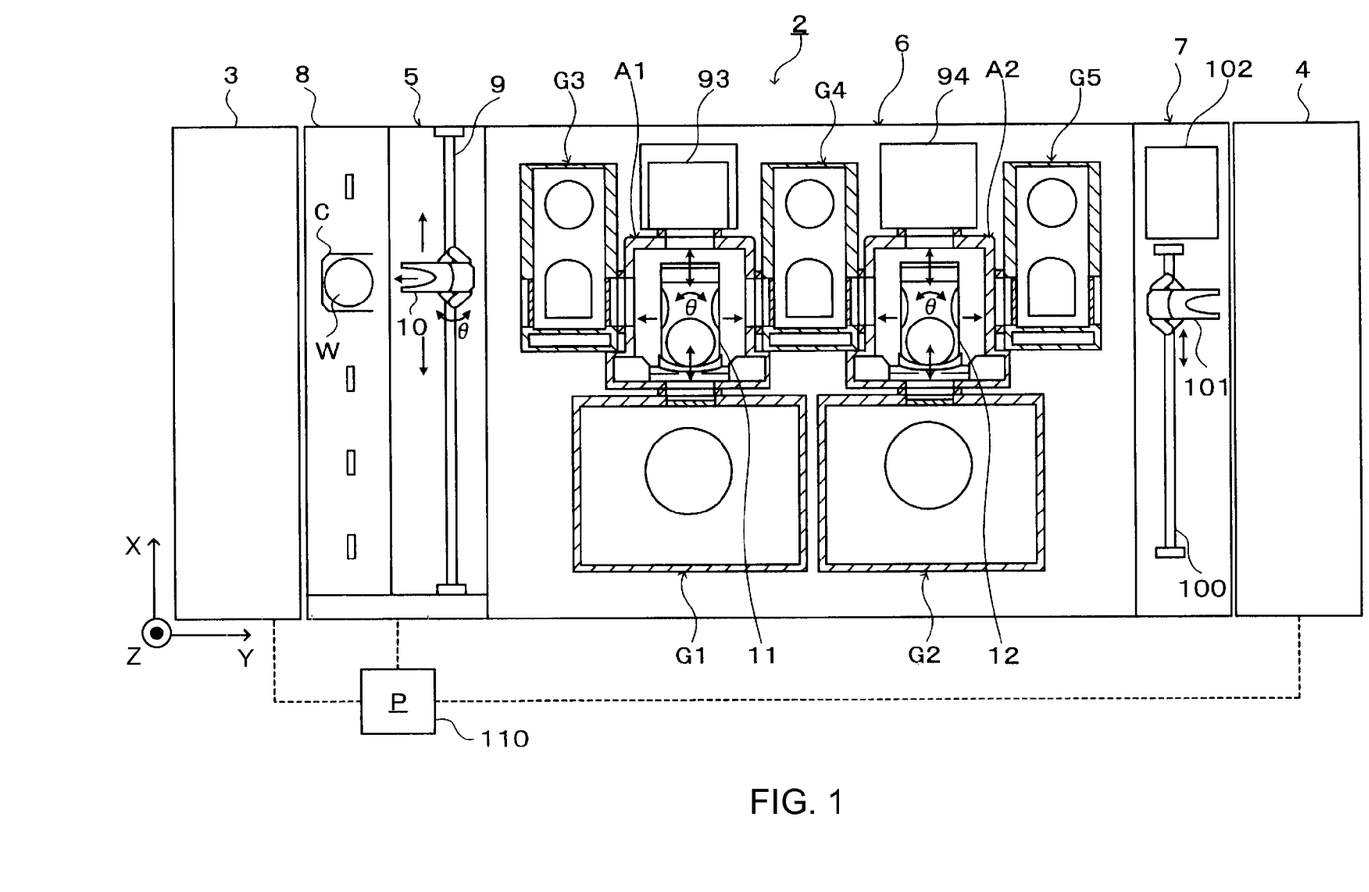
FIG. 1 is a schematic planar top view showing a substrate processing system in accordance with one embodiment.
Figure 2:
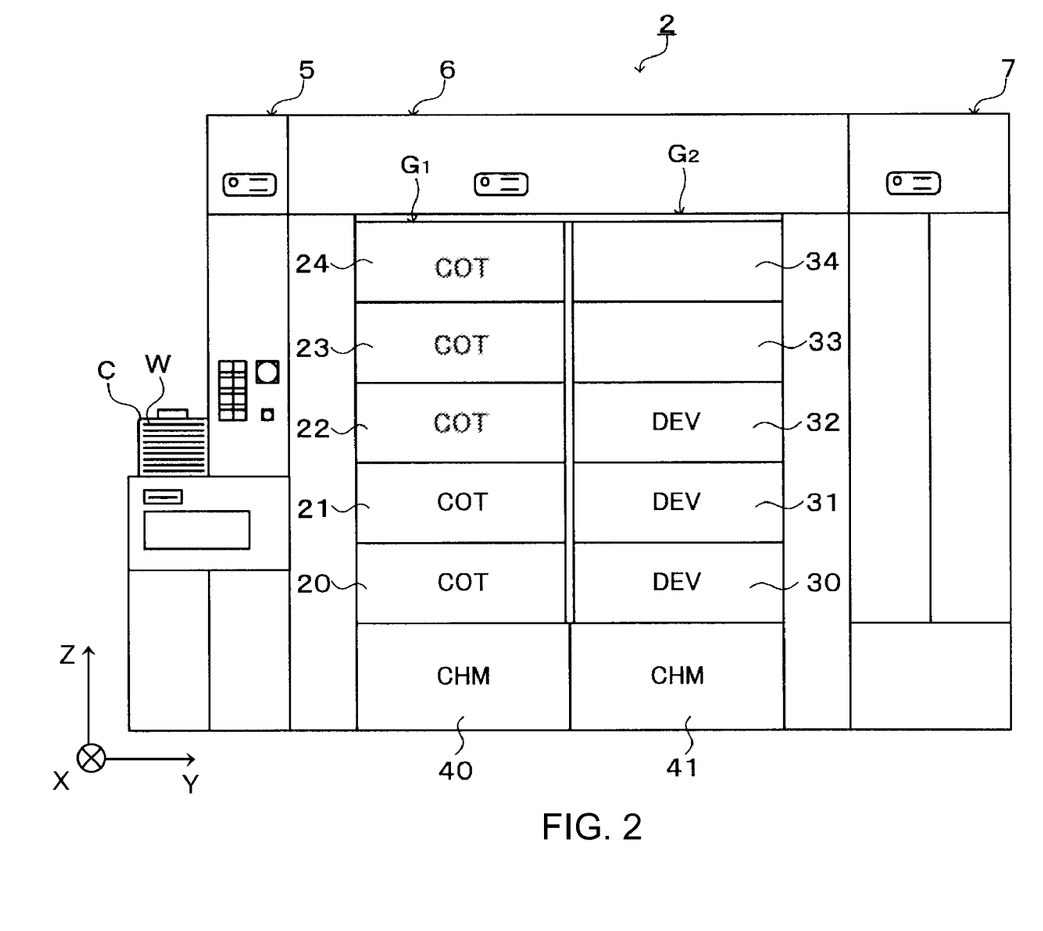
FIG. 2 is a schematic planar front view of the substrate processing system depicted in FIG. 1.
Figure 3:
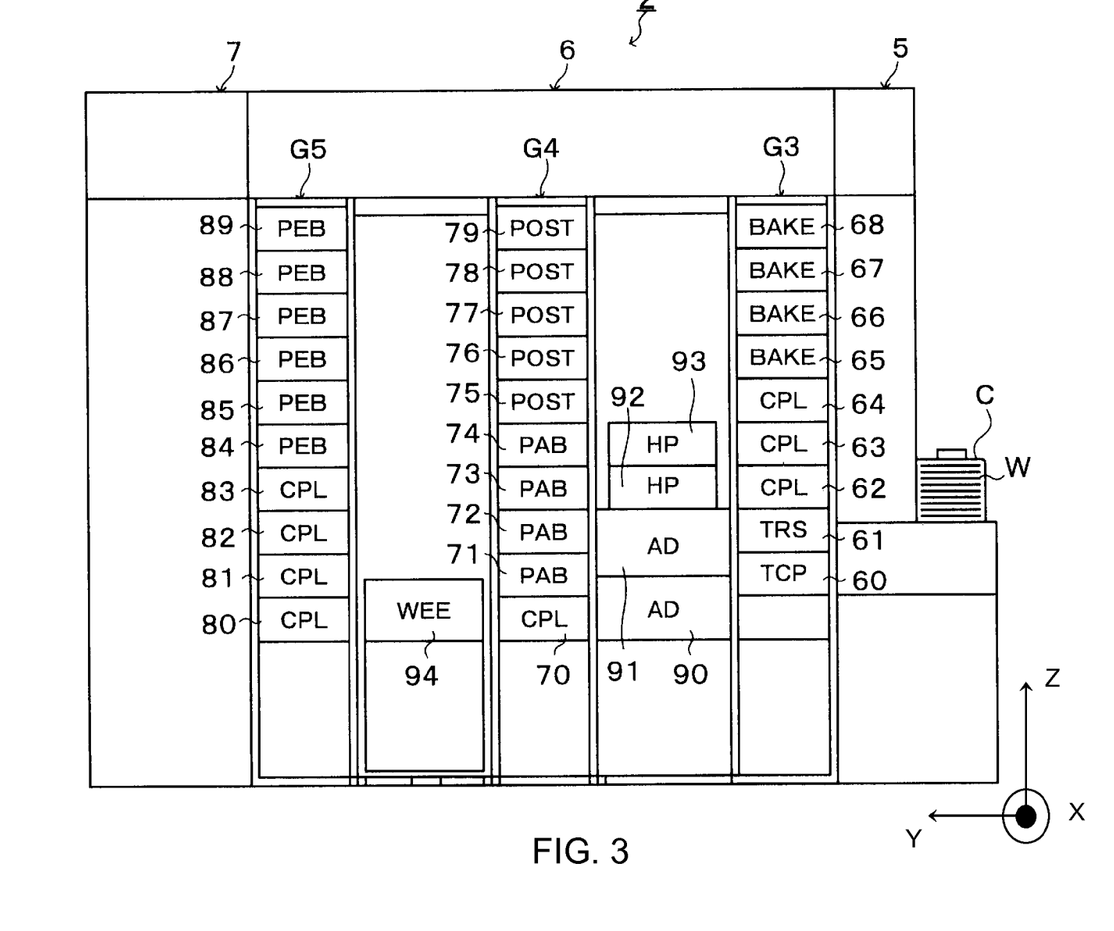
FIG. 3 is a schematic planar rear view of the substrate processing system depicted in FIG. 1.

Embodiments in accordance with the invention will be explained hereinafter with reference to the drawings. FIG. 1 is a schematic planar top view showing a configuration of a substrate processing system in accordance with the present embodiment. FIGS. 2 and 3 are schematic planar front and rear views of the substrate processing system depicted in FIG. 1, respectively.

The wafer processing system 1, as shown in FIG. 1, comprises a coater/developer system 2 for conducting a photolithography process, an etching apparatus 3 for etching a specific film on a wafer W, and an exposure apparatus 4 for exposing a specific film on a wafer W to optical radiation.

The coater/developer system 2 comprises a cassette station 5, a process station 6, and an interface station 7 that are integrally-connected. The cassette station 5 receives wafers W, for instance, 25 wafers in a cassette C, and transfers a wafer W from/to cassettes C. The process station 6 comprises a plurality of stacked process units for processing wafer by wafer in a lithographic process. The interface station 7 transfers wafer W from/to the exposure apparatus 4 adjacent to the process station 6.

The cassette station 5 comprises a cassette stage 8 on which a plurality of cassettes C can be set in line along an X-direction in the coater/developer system 2, i.e., a longitudinal direction as shown in FIG. 1. The cassette station 5 comprises a wafer conveyer 10 that can move along the X-direction on a guide rail 9. The wafer conveyer 10 also can move along the array direction of wafers stored in each cassette C, or Z(vertical)-direction, and can access wafers W in each cassette arrayed in line along the X-direction.

The wafer conveyer 10 can rotate in the Θ-direction about the Z-axis, and access a temperature-regulating unit 60 and a transition unit 61, both of which belong to a third process unit group G3, described below, in the process station 6.

In the present embodiment, the process station 6 adjacent to the cassette station 5 has five process-unit groups G1-G5, which has a plurality of stacked process units therein, respectively. The first and second process-unit groups G1, G2 are located from the side of cassette station 5 in that order at the minus side of Z-direction, or the lower side in FIG. 1, in the process station 6. The third to fifth process-unit groups G3-G5 are located from the side of the cassette station 5 in that order at the plus side of Z-direction, or the upper side in FIG. 1, in the process station 6. A first transfer unit A1 having a first transfer arm 11 therein is located between the third and forth process-unit groups G3, G4. The first transfer arm 11 can support a wafer W and selectively access each unit in the first, third and fourth process unit groups G1, G3, G4 to transfer the wafer W. A second transfer unit A2 having a second transfer arm 12 therein is located between the fourth and fifth process unit groups G4, G5. The second transfer arm 12 can support a wafer W and selectively access each device in the second, fourth and fifth process unit groups G2, G4, G5 to transfer the wafer W.

In the present embodiment, the first process unit group G1 comprises, as shown in FIG. 2, five coating units 20-24 stacked from the bottom. The coating units 20, 21 form a photoresist film on a wafer W as a second film by coating the wafer W with photoresist. The coating units 22, 23 form an anti-reflecting film as a first film, wherein the anti-reflecting film is configured to prevent light-reflection during an exposure process. The coating unit 24 forms a sacrificial layer as a third layer. The configuration of coating units 20-24 can be similar to each other or different depending on the coating materials. The first process unit group G1 also comprises a chemical box 40 for supplying various liquids to each unit in the first process-unit group G1, and it is located at the bottom thereof. In the present embodiment, the anti-reflecting film is more soluble in an alkaline solution than the un-exposed photoresist film, but it is less soluble than the exposed photoresist film. For instance, an un-exposed photoresist film does not dissolve in an alkaline solvent having a concentration to dissolve an anti-reflecting film, and the anti-reflecting layer does not dissolve in an alkaline solution having a concentration to dissolve an exposed photoresist film. The sacrificial film is also soluble in an alkaline solution, and it has a solubility different from a photoresist layer and an anti-reflecting layer, and it is tolerant to target-layer etching described below. The sacrificial layer is made of an aromatic or alicyclic compound, for instance.

In the present embodiment, the second process-unit group G2 has developing units 30-32 and liquid-process units 33, 34, stacked from bottom in five tiers.

The developing units 30-32 are configured for developing an exposed photoresist film on a wafer W by supplying a developing liquid, for instance. The liquid-process units 33, 34 are configured for removing a specific film by supplying alkaline solution. The coating unit 24 forms a sacrificial layer as a third layer. The configuration of the developing units 30-32 and the liquid-process unit 33, 34 can be similar to each other or different. The second process-unit group G2 comprises also a chemical box 41 for supplying various liquids to each unit at the bottom thereof.

In the present embodiment, the third process unit group G3 comprises, as shown in FIG. 3, temperature-regulating unit 60, transition unit 61, high-precision temperature-regulating units 62-65 and high-temperature-process units 65-68, stacked from bottom in nine tiers. The high-precision temperature-regulating units 62-65 regulate the temperature of wafer W under high-precision temperature control. The high-temperature-process units 65-68 process a wafer W in high temperature.

In the present embodiment, the forth process-unit group G4 comprises a high-precision temperature-regulating unit 70, pre-baking units 71-74 and post-baking units 75-79, stacked from bottom in ten tiers. The pre-baking units 71-74 heat a photoresist-coated wafer W. The post-baking units 75-79 heat a developed wafer W.

The fifth process-unit group G5 comprises a plural of thermal process units heating a wafer W, such as high-precision temperature-regulating units 80-83 and post-exposure-baking unit 84-89, stacked from bottom in ten tiers.

At the plus side of the X-direction, adjacent to the first transfer unit A1, as shown in FIGS. 1 and 3, there are a plurality of process units, stacked from bottom in four tiers, namely, adhesion units 90, 91 for hydrophobizing a wafer W, and heating units 92, 93 for heating a wafer W. In the present embodiment, at the plus side of the X-direction, adjacent to the second transfer unit A2, as shown in FIG. 1, there is an edge exposure apparatus 94 for exposing the edge portion of wafer W to optical radiation.

In the present embodiment, the interface station 7, as shown in FIG. 1, comprises a wafer conveyer 101 and a buffer cassette 102 therein. The wafer conveyer 101 moves on a guide rail 100 extending along the X-direction. The wafer conveyer 101 also moves along the Z-direction and rotates about the Z-axis for accessing and transferring a wafer W to the exposure apparatus 4 adjacent to the interface station 7, the buffer cassette 102 and the fifth process unit group G5.

A controller 110 located in the substrate system 1, as shown in FIG. 1, controls a wafer process in the substrate process system 1 configured as described above. The controller 110 is a computer and has program storage for storing a program P, for instance. The program P controls an operation of various process units and driving systems, such as the conveyer described above, for processing a wafer W with a specific recipe described below. The program P is stored in a readable medium, such as a hard disk, a flexible disk, a memory card, a compact disk and a magnet-optical disk, and is installed in the controller 110, or a computer.

Figure 4:
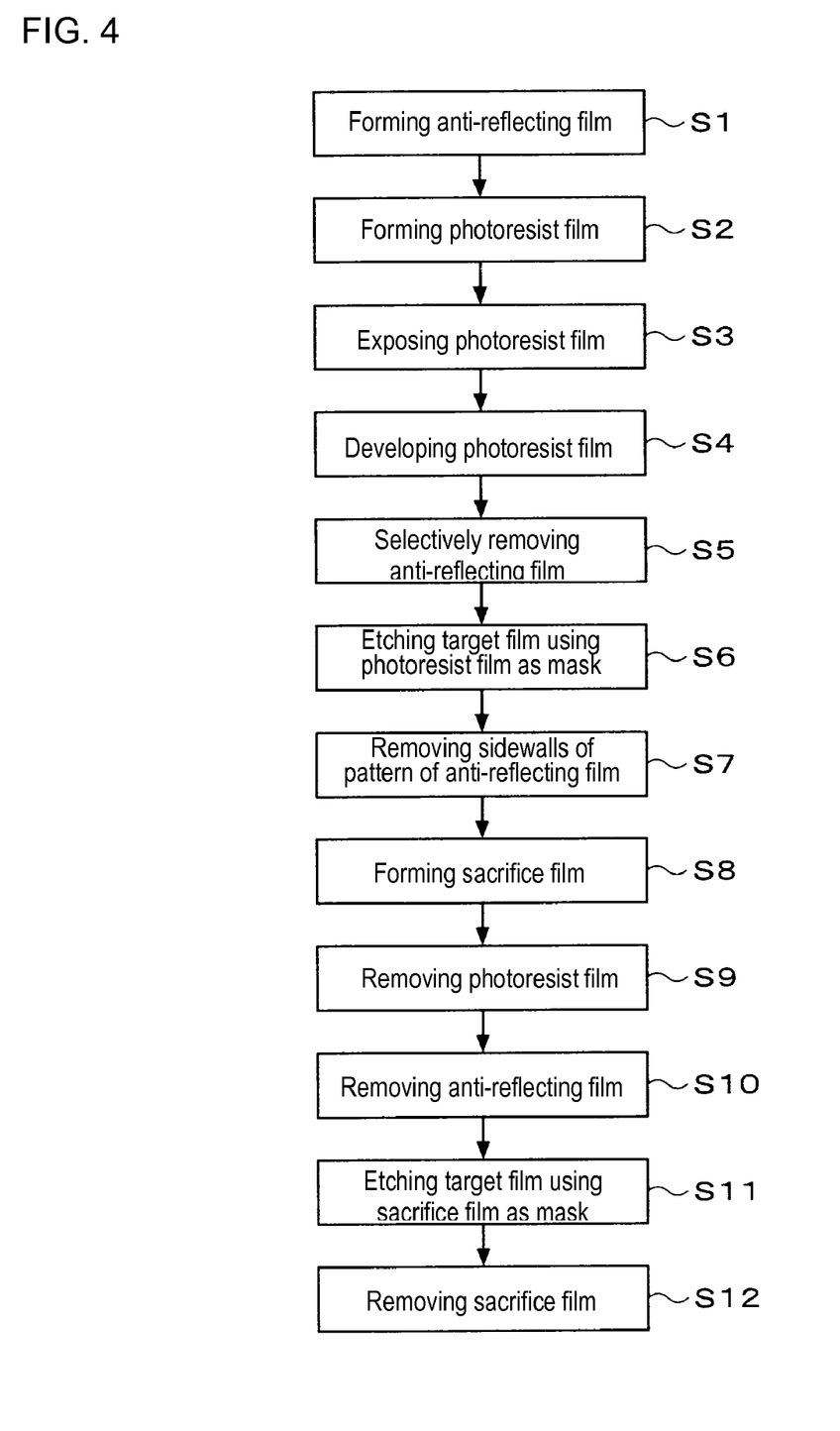
FIG. 4 is a flowchart showing a sequence of processing a substrate in accordance with another embodiment.

The substrate process system 1 in accordance with the present invention is configured as described above. The process for patterning a target layer on a wafer W in the substrate processing system 1 will be explained hereinafter. FIG. 4 Shows a main process flow for processing a wafer W.

Figure 5A:
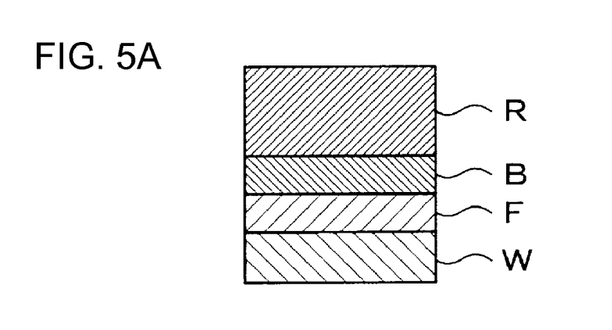
FIGS. 5A through 5H are schematic planar side views of a portion of substrate for sequentially showing a method for processing a substrate in accordance with another embodiment.

The cassette C on the cassette stage 8 stores the wafer W to be processed, on which a target film F, such as an organic bottom film, is formed beforehand, as shown in FIG. 5A. The wafer conveyer 10 transfers the wafer W from the cassette C to the temperature-regulating unit 60 in the third process unit group G3. After transfer to the temperature-regulating unit 60, the wafer W is regulated to a predetermined temperature and transferred to the coating unit 22 by the first transfer arm 11. In the coating unit 22, an anti-reflecting film B is formed on the target film F on the wafer W (Step S1 in FIG. 4).

After forming the anti-reflecting film B, the wafer W is transferred by the first transfer arm 11 sequentially to the heating unit 92, to the high-temperature-process unit 65, and to a high-precision temperature-regulating unit 70. After processing in each unit, the wafer W is transferred to the coating unit 20. In the coating unit 20, a photoresist film R is formed on the anti-reflecting film B on the wafer W, as shown in FIG. 5A (Step S2 in FIG. 4).

After forming the photoresist film R, the wafer W is transferred to the pre-baking unit 71 by the first transfer arm 11 and heated. Then, the second transfer arm 12 transfers the wafer W sequentially to the edge exposure apparatus 94 and to the high-precision temperature-regulating unit 83. After processing in each unit, the wafer W is transferred to the exposure apparatus 4 by the wafer transfer unit 101 and the photoresist film R is exposed to optical radiation having a specific pattern (Step S3 in FIG. 4). Here, the line width CD1 of pattern exposed on the photoresist film R is wider than the required line width CD2 of patterned target film on the wafer W, described below.

After exposing, the wafer W is transferred to the post-exposure baking unit 84 by the wafer conveyer 101 and heated.

Figure 5B:
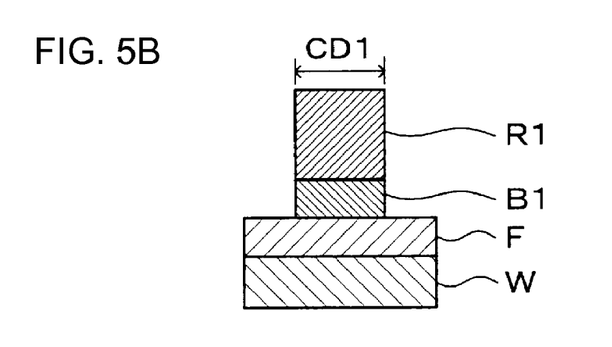

After heating, the wafer W is transferred to the high-precision temperature-regulating unit 81 by the second transfer arm 12, where its temperature is regulated, and transferred to the developing unit 30. The developing unit 30 supplies developing liquid having a specific concentration to the wafer W and develops the exposed photoresist film R. Then, a pattern R1 having the line width CD1 is formed of the photoresist film R, as shown in FIG. 5B (Step S4 in FIG. 4). In the present embodiment, the developing liquid supplied to the wafer has a concentration that can dissolve the exposed portion of the resist film R selectively. For instance, the concentration is about 1.0 percent by weight. The concentration of the developing liquid is determined based on a table that is stored in the controller 110 and describes the relationships between types of photoresist films R and the concentrations of developing liquid, for instance. The concentration determined in the controller 110 is output to the chemical box 40, which supplies developing liquid having the determined concentration from the chemical box 40 to the developing unit 30. In another embodiment, the unexposed portion of the photoresist film R is selectively dissolved in the developing process. In such case, instead of an alkaline solution, a xylene series organic solvent is usually used as a developing liquid. The xylene series organic solvent has a concentration that can dissolve the exposed portion of the resist film R selectively. For instance, the concentration is about 1.0 percent by weight.

After that, the same developing unit 30 cleans the wafer W and supplies a processing liquid to the wafer W for dissolving unprotected portion of the anti-reflecting film B, where the photoresist film B has been removed, or the portion other than the pattern R1. Then, a pattern B1 having the line width same to the line width CD1 is formed of anti-reflecting film B, as shown in FIG. 5B (Step S5 in FIG. 4). In the present embodiment, the processing liquid supplied to the wafer W is an alkaline solution, which is the same as the developing liquid. The processing liquid has a concentration that is higher than the developing liquid and can dissolve the anti-reflecting film B, for instance, it is about 2.38 percent by weight. Similar to the developing liquid as described above, the concentration of the developing liquid is also determined based on a table that is stored in the controller 110 and describes relationships between types of anti-reflecting films and the concentrations of the processing liquid. The developing liquid having the determined concentration is supplied from the chemical box 40 to the developing unit 30.

After forming the patterns R1, B1, the wafer W is transferred by the second transfer arm 12 to the post-baking unit 75 and heated. After heating, the wafer W is transferred to the high-precision temperature-regulating unit 62, where its temperature is regulated. Then, the wafer W is transferred to the transition unit 61 by the first transfer arm 11, and returned to the cassette C on the cassette station 5 by the wafer conveyer 10.

Figure 5C:
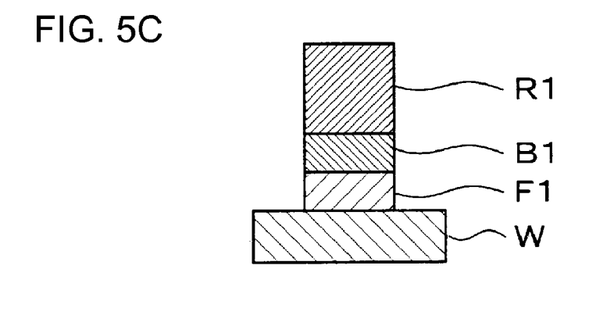

After being returned to the cassette C, the wafer W is transferred from the coater/developer system 2 to the etching apparatus 3. In the etching apparatus 3, the target film F is etched using the pattern R1 as a mask. Then, a pattern F1 having the line width CD1 is formed of the target film F, as shown in FIG. 5C (Step S6 in FIG. 4).

Figure 5D:
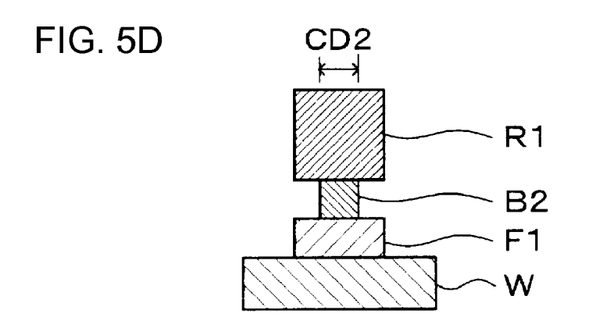
Figure 5E:
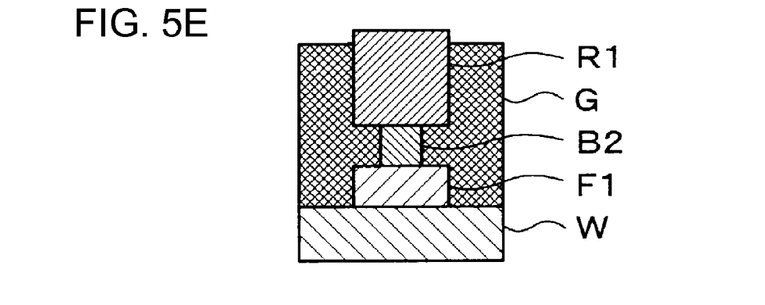

After forming the pattern F1, the wafer W is transferred to the cassette C. Then, the wafer W is transferred from the cassette C to the liquid-process unit 33 by the wafer conveyers 10 and the first and second transfer arms 11, 12. In the liquid-process unit 33, the processing liquid is supplied to the wafer for dissolving the sidewalls of the pattern B1. Then, a pattern B2 having the line width CD2 is formed, as shown in FIG. 5D (Step S7 in FIG. 4). In the present embodiment, the controller 110 controls the period to dissolve the sidewalls of pattern B1 for obtaining the pattern B2 having the intended line width CD2. The controller 110 determines dissolving period based on the concentration of processing liquid and/or the heating period in the post-baking unit 76.

After forming pattern B2, the wafer W is transferred to the post-baking unit 76 by the second transfer arm 12 and heated. The wafer W is transferred to the high-precision temperature-regulating unit 63 and its temperature is regulated. Then, the wafer W is transferred to the coating unit 24. The coating unit 24 forms a sacrificial film G that covers the anti-reflecting pattern B2 and the target pattern F1 but does not cover the top of the photoresist pattern R1 (Step S8 in FIG. 4). If covered by the sacrificial film G, the top of pattern R1 is exposed by coating an alkaline solution on the sacrifice film G. In this case, because the alkaline solution coated on the sacrifice film G has the concentration different from that of the developing liquid, the alkaline solution can dissolve only the surface of sacrificial layer G without dissolving the pattern R1.

Figure 5F:
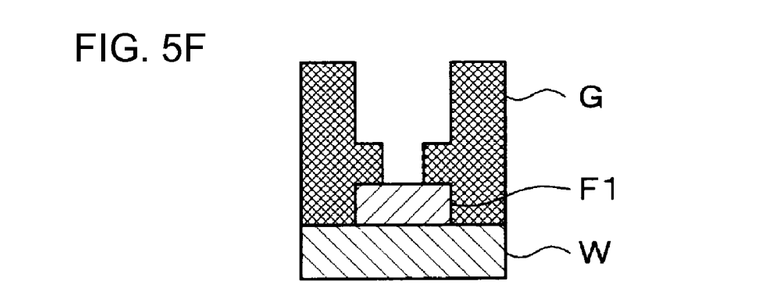

After forming the sacrificial film G, the wafer W is transferred sequentially to the heating unit 93, to the high-temperature-process unit 66, and to the high-precision temperature-regulating unit 70 by the transfer arm 11. After processing in each unit, the wafer W is transferred to the liquid-process unit 34 by the second transfer arm 12. In the liquid-process unit 34, a solvent, such as a thinner like PGMEA or butyl acetate, for the photoresist film R is supplied to the wafer W. Then, the patterns R1, B2 are dissolved for removing, as shown in FIG. 5F (Step S9 and S10 in FIG. 4).

After removing the patterns R1, B2, the wafer W is transferred to the post-baking unit 76 by the transfer arm 12 and heated. Then, the wafer W is transferred to the high-precision temperature-regulating unit 64 and its temperature is regulated. After that, the wafer W is transferred to the transition unit 61 by the transfer arm 11 and to the cassette C on the cassette station 5 by the wafer conveyer 10.

Figure 5G:
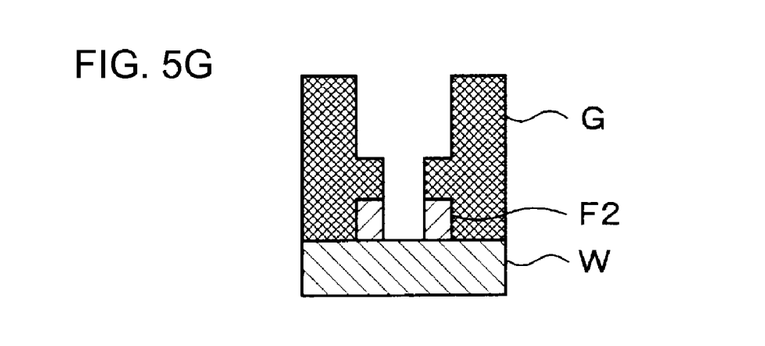

After returning to the cassette C, the wafer W is transferred from the coater/developer system 2 to the etching apparatus 3. In the etching apparatus 3, the pattern F1 is etched using the sacrifice film G as a mask. Then, a pattern F2 having the intended line width CD2 is formed of the sacrifice film G, as shown in FIG. 5G (Step S11 in FIG. 4).

Figure 5H:
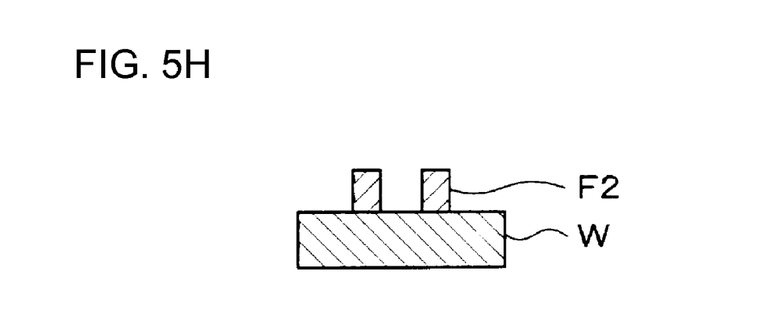

After forming the pattern F2, the wafer W is transferred to a plasma ashing apparatus (not shown), for instance. In the plasma ashing apparatus, the sacrifice film G on the wafer W is removed with plasma, as shown in FIG. 5H (Step S12 in FIG. 4). In this way, the sequence of processing the wafer W is finished.

According to the embodiment described above, firstly, it is possible to form the pattern F1 of the target film F having the line width CD1, through forming the patterns R1, B1 of the photoresist film R and the anti-reflecting film B, respectively, and etching the target film F using the pattern R1 as a mask. Secondly, it is possible to form the pattern B2 having the line width CD2 narrower than the line width CD1, through removing the sidewalls of the pattern B1 by resolving only the anti-reflecting film B without resolving the photoresist film R. It is due to the difference of solubility between the anti-reflecting film B and the photoresist film R. Finally, it is possible to precisely form the pattern F2 of the target film F having the intended line width CD2, through forming the sacrificial film G to cover the patterns B2 and the pattern F1, removing the patterns R1, B2, and etching the pattern F1 using the sacrificial film G as a mask. Besides, according to the present embodiment, the photoresist layer R on the target layer F is exposed only once. In other words, it is unnecessary to expose twice as in the conventional process. Therefore, the intended fine pattern F2 of the target film F can be formed precisely and effectively.

Figure 6A:
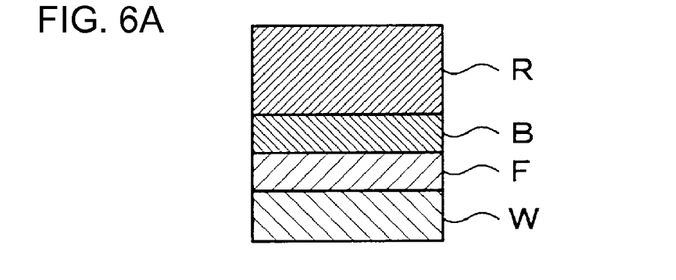
FIGS. 6A through 6H are schematic planar side views of a portion of substrate for sequentially showing a method for processing a substrate in accordance with another embodiment.
Figure 6B:
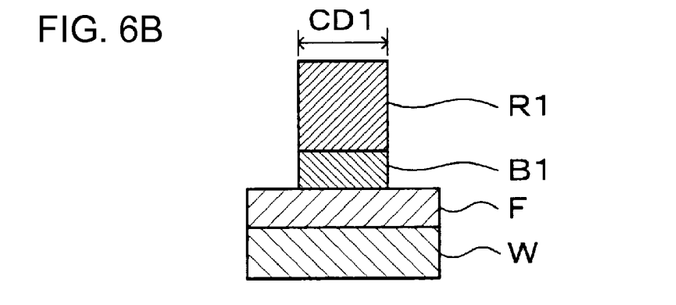
Figure 6C:
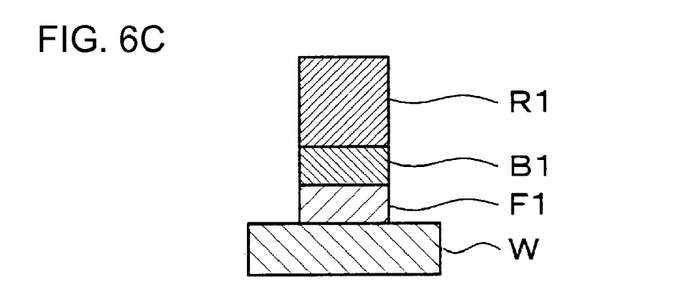
Figure 6D:
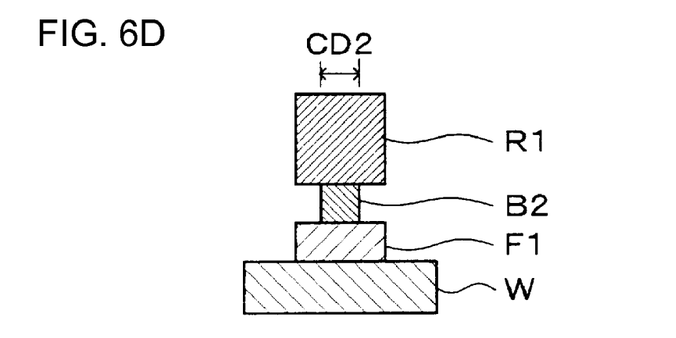
Figure 6E:
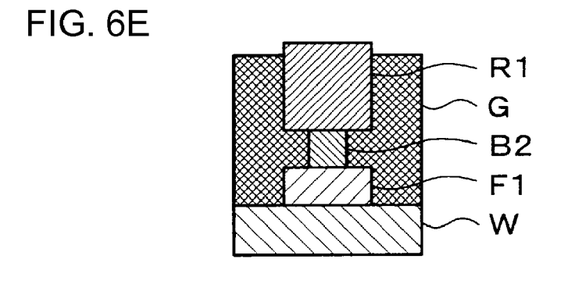
Figure 6F:
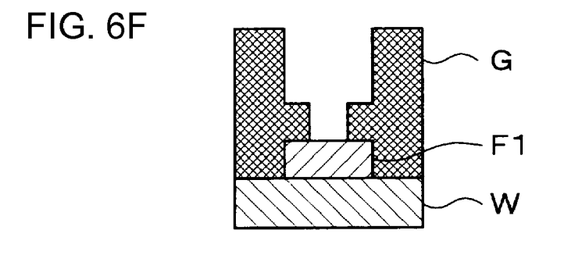
Figure 6G:
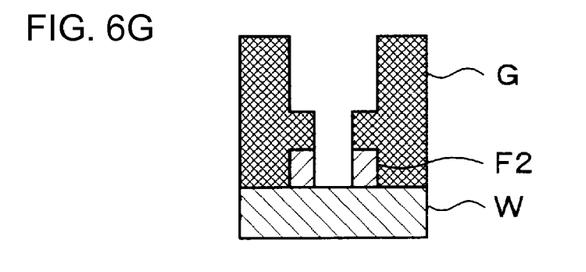
Figure 6H:
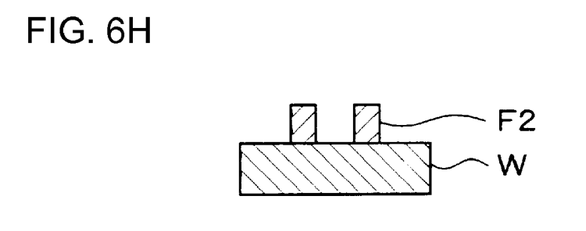

In another embodiment, instead of dissolving the anti-reflecting layer film B in the developing unit 30 (Step S5 in FIG. 4), the anti-reflecting film B is etched using the pattern R1 as a mask in the etching apparatus 3 for forming the pattern B1 having the line width CD1, as shown in FIG. 6B. In such case, it is possible to etch the target layer F using the pattern R1 as a mask in the same etching apparatus 3, as shown in FIG. 6C. Remaining Steps S1-S4 and S7-S12 in FIG. 4 are processed in a manner similar to the preceding embodiment.

Figure 7:
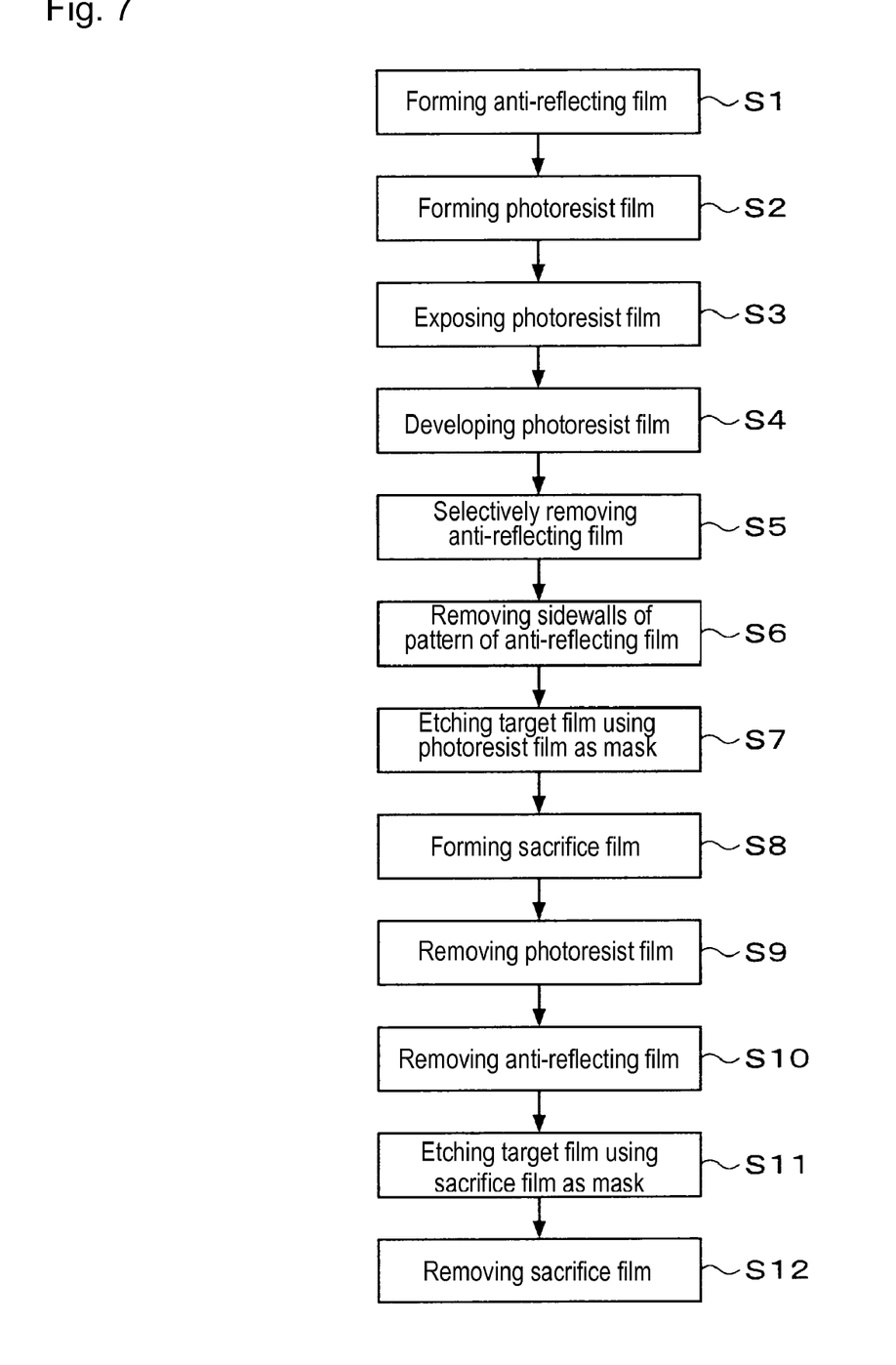
FIG. 7 is a flowchart showing a sequence of processing a substrate in accordance with another embodiment.
Figure 8A:
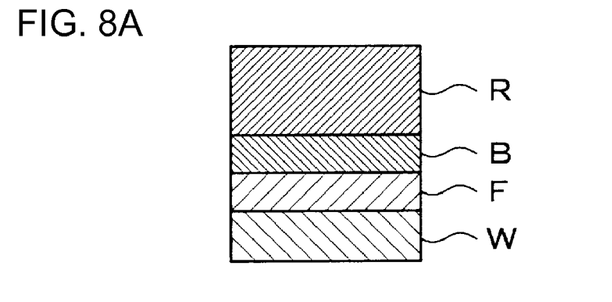
FIGS. 8A through 8H are schematic planar side views of a portion of substrate for sequentially showing a method for processing a substrate in accordance with another embodiment.
Figure 8B:
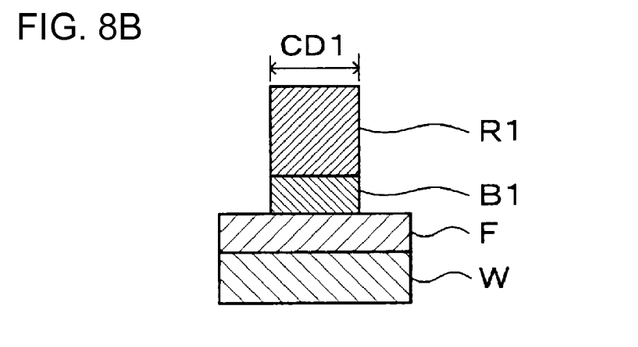
Figure 8C:
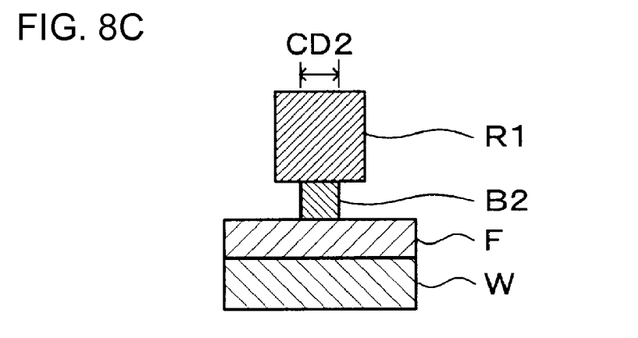
Figure 8D:
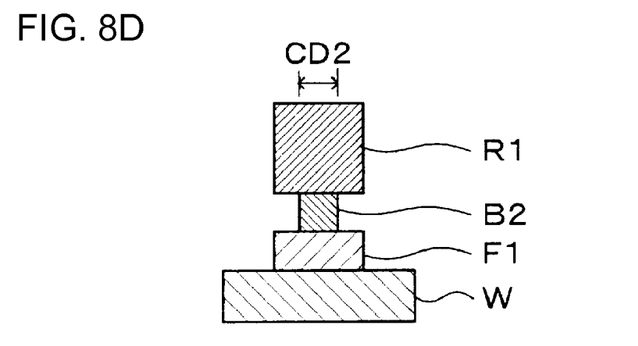
Figure 8E:
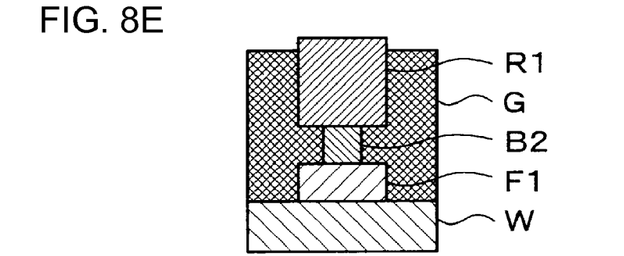
Figure 8F:
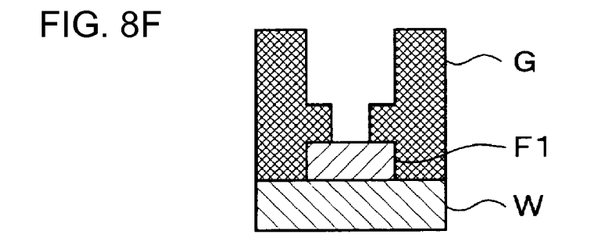
Figure 8G:
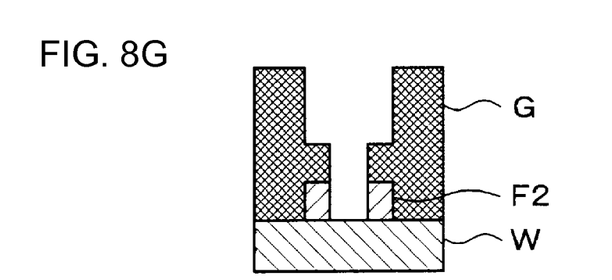
Figure 8H:
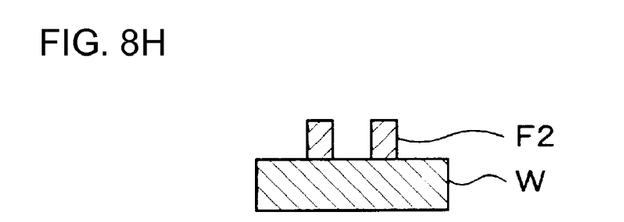

FIG. 7 shows a process flow in accordance with another embodiment. Instead of forming pattern B2 by removing the sidewalls of pattern B1 (Step S7 in FIG. 4) after forming the pattern F1 (Step S6 in FIG. 4), the pattern B2 is formed by removing the sidewalls of pattern B1, as in FIG. 8C (Step S6 in FIG. 7) before etching the target layer F using the pattern R1 (Step S7 in FIG. 7). Even in such case, the pattern F1 of the target film F having the line width CD1 can be formed, as shown in FIG. 8D. Besides, it can prevent the deposition of undesirable materials on the pattern B1 during etching the target film F because the sidewalls of the pattern B1 is removed before etching the target film F in the etching apparatus 3. The other Steps S1-S5 and S8-S12 in FIG. 7 are processed in a manner similar to the preceding embodiment.

Figure 9A:
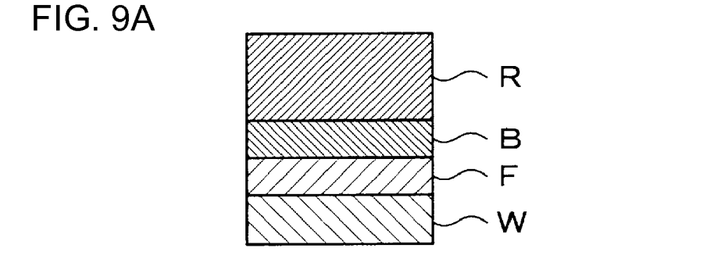
FIGS. 9A through 9H are schematic planar side views of a portion of substrate for sequentially showing a method for processing a substrate in accordance with another embodiment.
Figure 9B:
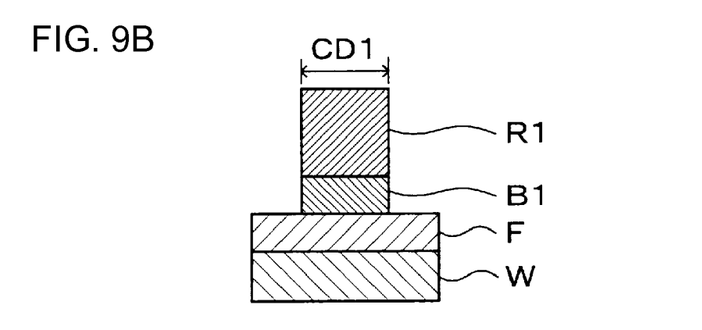
Figure 9C:
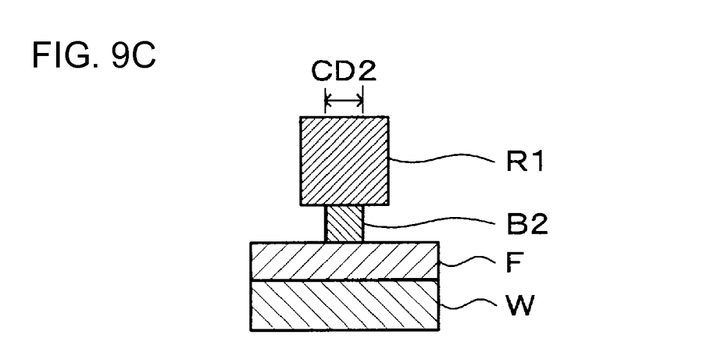
Figure 9D:
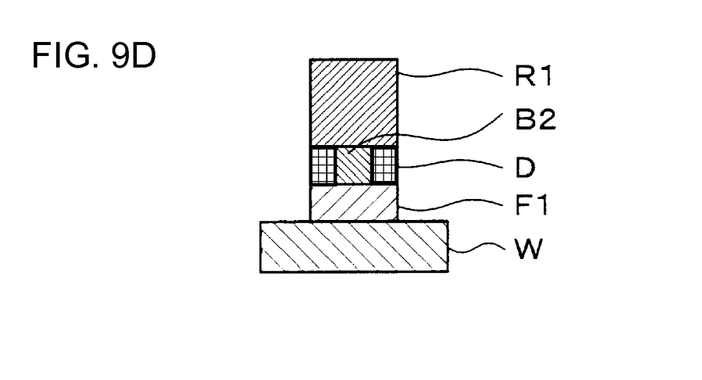
Figure 9E:
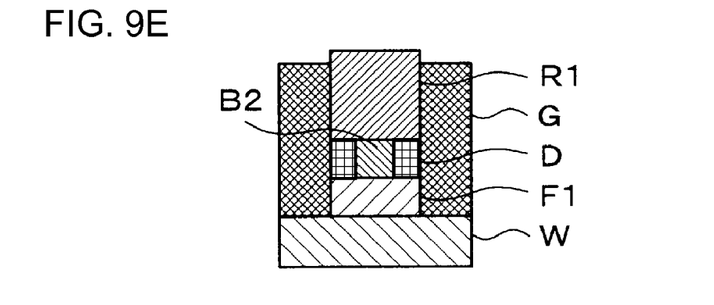
Figure 9F:
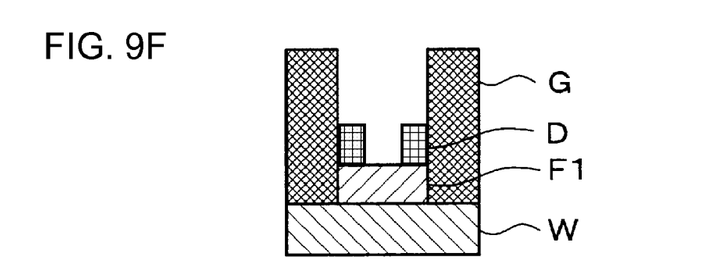
Figure 9G:
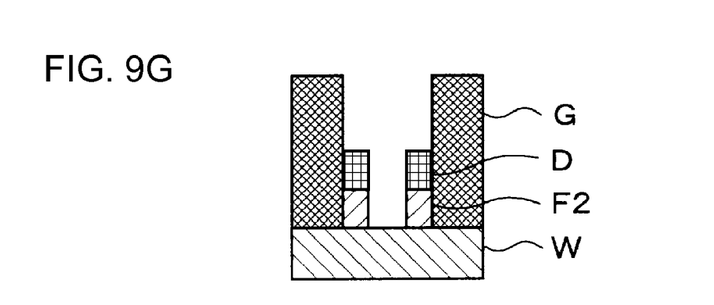
Figure 9H:
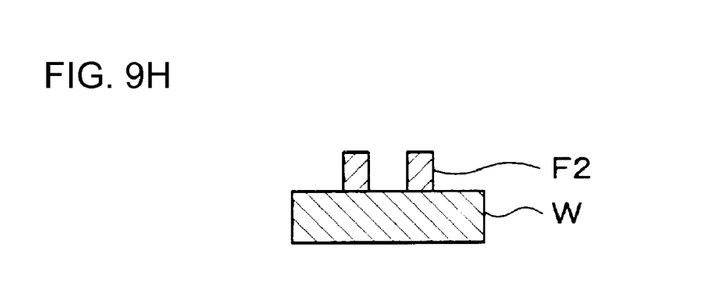

In another embodiment, a deposited film D can be filled in the sidewall portion removed from the pattern B1, as shown in FIG. 9D, by supplying a deposition gas, such as $CF_4$ gas, when etching the target film F using the pattern R1 as a mask in the etching apparatus 3 (Step S7 in FIG. 7). The deposited layer D is made of fluorinated compounds. In such case, the pattern F1 of the target layer F can be etched using the deposited layer D as a mask in the etching apparatus 3, as shown in FIG. 9G (Step S11 in FIG. 7). Then, the pattern F2 of the target film F having the line width CD2 can be formed, as shown in FIG. 9H. In such case, the sacrificial layer G formed similar to the preceding embodiment, as shown in FIG. 9E (Step S8 in FIG. 7), can protect the wafer W during etching the pattern F1. The other Steps S1-S6, S9-S10 and S12 in FIG. 7 are processed in a manner similar to the preceding embodiment. The fourth film also can be formed by coating before etching the target film F using the pattern R1 as a mask.

In another embodiment, instead of exposing the top of the photoresist layer R by dissolving the surface of sacrificial layer G (Step S8 in FIG. 4), the top of the photoresist layer R is hydrophobized before forming the sacrifice layer G on the wafer W in the coating unit 24. In such case, the top of the pattern R1 can be exposed without dissolving the surface of sacrificial layer G.

In another embodiment, instead of formed the sacrificial layer G by coating in the coating unit 24, the sacrificial layer G can be formed with other processes, such as a CVD (chemical vapor deposition) process in a plasma CVD apparatus (not shown). When covered by the sacrificial layer G, the top of pattern R1 can be exposed by etching back the surface of sacrificial layer G.

In another embodiment, instead of removing the sacrificial layer G by plasma ashing (Step S12 in FIG. 4), the sacrificial layer G can be removed by wet etching.

Although it is explained that the intended fine pattern F2 is formed of the target film F on the wafer W in the preceding embodiments, the method in accordance with the present invention can be applied to pattern the surface of wafer W itself for forming a fine pattern.

In the preceding description, the several embodiments of the present invention are explained with reference to attached drawings. However, the present invention is not limited to those embodiments. The specification and drawings are, accordingly, to be regarded in an illustrative rather than a restrictive sense. It is clear that those skilled in the art can make various modifications and changes thereto without departing from the broader spirit and scope of the invention, as set forth in the claims. The present invention also can be applied to a substrate other than a semiconductor wafer, for instance, a substrate for a flat panel display or mask reticle for a photo mask.

What is claimed as new and is desired to be secured by Letters Patent of the United States is:

1. A method for processing a substrate on which a target film is formed, comprising:
    forming a first film on the target film;
    forming a second film on the first film, the second film being photosensitive;
    patterning the second film with a photolithography process;

removing a portion of the first film selectively using the second film as a mask;

removing a first portion of the target film selectively using the second film as a mask;

reducing the width of first film to an intended width by removing sidewall portion thereof;

forming a third film at least on the first film and on the top of the target film;

removing the first film and the second film; and removing a second portion of the target film using the third film as a mask.

2. The method for processing a substrate according to claim 1, wherein reducing the width of the first film to an intended width is conducted between removing the portion of the first film selectively and removing the first portion of the target film selectively.

3. The method for processing a substrate according to claim 2,
wherein removing the first portion of the target film selectively and removing the second portion of the target film are conducted by etching method.

4. The method for processing a substrate according to claim 3,
wherein a fourth film is deposited in the sidewall portion removed from the first film when removing the first portion of the target film selectively, and
wherein the third and fourth films are used as a mask during removing the second portion of the target film.

5. The method for processing a substrate according to claim 3,
wherein a fourth film is coated in the sidewall portion removed from the first film when removing the first portion of the target film selectively, and
wherein the third and fourth films are used as a mask during removing the second portion of the target film.

6. The method for processing a substrate according to claim 1, wherein the first film is soluble in an alkaline solution.

7. The method for processing a substrate according to claim 6,
wherein removing the portion of the first film selectively is conducted by supplying an alkaline solution and dissolving the portion of the first film.

8. The method for processing a substrate according to claim 6,
wherein reducing the width of the first film to an intended width is conducted by supplying an alkaline solution and dissolving the sidewall portion.

9. The method for processing a substrate according to claim 8,
wherein the period of supplying the alkaline solution is controlled for obtaining the intended width.

10. The method for processing a substrate according to claim 8,
wherein the concentration of the alkaline solution is controlled for obtaining the intended width.

11. The method for processing a substrate according to claim 1,
wherein removing the first portion of the first film selectively is conducted by an etching method.

12. The method for processing a substrate according to claim 1,
wherein removing the first portion of the target film selectively and removing the second portion of the target film are conducted by etching method.

13. The method for processing a substrate according to claim 1,
wherein the third film is formed by a chemical vapor deposition method and the surface portion of the third film is etched back till the surface of the second film is uncovered, when forming a third film.

14. The method for processing a substrate according to claim 1,
wherein the third film is formed by coating alkali-soluble liquid and the surface portion of the third film is dissolved till the surface of the second film is uncovered, when forming a third film.

15. A program recorded on a non-transitory computer readable medium for performing the method according to claim 1.

* * * * *